US010073143B2

United States Patent
Leidich et al.

(10) Patent No.: US 10,073,143 B2
(45) Date of Patent: Sep. 11, 2018

(54) METHOD FOR DETECTING ANOMALIES IN A BATTERY CELL, AND SHORT-CIRCUIT SENSOR SYSTEM

(71) Applicant: Robert Bosch GmbH, Stuttgart (DE)

(72) Inventors: Stefan Leidich, Rutesheim (DE); Schumann Schumann, Rutesheim (DE); Fabian Henrici, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 54 days.

(21) Appl. No.: 15/126,605

(22) PCT Filed: Feb. 26, 2015

(86) PCT No.: PCT/EP2015/054015
§ 371 (c)(1),
(2) Date: Sep. 16, 2016

(87) PCT Pub. No.: WO2015/139927
PCT Pub. Date: Sep. 24, 2015

(65) Prior Publication Data
US 2017/0082693 A1   Mar. 23, 2017

(30) Foreign Application Priority Data

Mar. 18, 2014 (DE) .................. 10 2014 204 956

(51) Int. Cl.
*G01R 31/36* (2006.01)
*G01R 31/02* (2006.01)
(Continued)

(52) U.S. Cl.
CPC ......... *G01R 31/362* (2013.01); *G01R 31/025* (2013.01); *H01M 10/48* (2013.01); *G01R 19/12* (2013.01); *G01R 31/3606* (2013.01)

(58) Field of Classification Search
CPC .... G01R 31/362; G01R 31/025; G01R 19/12; G01R 31/3606; H01M 10/48
(Continued)

(56) References Cited

U.S. PATENT DOCUMENTS

2006/0208708 A1   9/2006   Ishishita
2009/0099799 A1   4/2009   Barsoukov et al.
(Continued)

FOREIGN PATENT DOCUMENTS

DE        10342633        4/2005
DE      102006000086      9/2006
(Continued)

OTHER PUBLICATIONS

International Search Report for Application No. PCT/EP2015/054015 dated Jun. 2, 2015 (English Translation, 3 pages).

*Primary Examiner* — Melissa Koval
*Assistant Examiner* — Courtney McDonnough
(74) *Attorney, Agent, or Firm* — Michael Best & Friedrich LLP (57) ABSTRACT

The invention relates to a method for detecting anomalies in a battery cell (22), wherein a short-circuit sensor system (20) detects events (44) in a signal of a terminal voltage of the battery cell, which events have successive edges in an interval of time of microseconds, and wherein events detected by the short-circuit sensor system are transmitted to a battery management system (16) which determines anomalies in the battery cells using the detected events. A short-circuit sensor system (20) and a battery system (12) which are set up to carry out the method are also stated.

10 Claims, 4 Drawing Sheets

(51) Int. Cl.
*H01M 10/48* (2006.01)
*G01R 19/12* (2006.01)

(58) Field of Classification Search
USPC .......................................... 324/426
See application file for complete search history.

(56) References Cited

U.S. PATENT DOCUMENTS

| | | | |
|---|---|---|---|
| 2011/0316454 A1* | 12/2011 | Bouchez | H02K 3/28 318/139 |
| 2012/0004873 A1* | 1/2012 | Li | B60L 3/0046 702/63 |
| 2013/0122332 A1* | 5/2013 | van Lammeren | H01M 10/5257 429/61 |

FOREIGN PATENT DOCUMENTS

| | | |
|---|---|---|
| DE | 102008062656 | 6/2010 |
| DE | 102011077448 | 12/2012 |
| EP | 2403105 | 1/2012 |
| JP | 2003009405 | 1/2003 |
| WO | 2012002941 | 1/2012 |

* cited by examiner

METHOD FOR DETECTING ANOMALIES IN A BATTERY CELL, AND SHORT-CIRCUIT SENSOR SYSTEM

BACKGROUND OF THE INVENTION

The invention relates to a method for detecting anomalies in a battery cell, and also to a short-circuit sensor system and a battery system which are designed for carrying out the method.

Present-day battery management systems monitor cell voltages, current intensities and cell temperatures with sampling rates of typically 20 to 50 Hz. With the aid of these variables and prior knowledge determined experimentally, for example on the basis of characteristic curves, a monitoring circuit is realized on the basis of a theoretical model of the battery cell. Typical variables determined by the battery management system (BMS) are the state of charge (SOC), the internal resistance and the general state (SOH, state of health) of the battery cells, in order for example to predict the available power and to provide framework stipulations for the operating parameters of the battery cells.

In lithium-ion batteries, the high quantity of chemical and electrical energy constitutes a potential risk. The chemical energy stored in the active materials of the cathode and the anode exceeds the stored electrical energy by a multiple. In this case, the release of the chemical energy by exothermic decomposition requires an activation energy in the form of heating. Depending on the materials used, the critical temperature is 150-200° C. The required temperature for initiating so-called thermal runaway may arise both as a result of external heating and as a result of internal heating of the battery cell. The external heating typically eludes an accurate prediction. The internal heating arises for example as a result of the release of electrical energy, as a result of electrical energy being converted into heat. In particular, this can be effected by internal electrical short circuits between cathode and anode which occur for example as a result of metallic particles, metal dendrites or electrical contact between the active materials. These processes are detected by battery management systems in the context of monitoring thermal runaway.

US 2013 012 2332 A1 describes a system comprising an integrated circuit, a pressure sensor and a communication device, which system can be mounted into a battery cell. The system serves for determining the SOC and the SOH of the battery cell. For detecting potential harmful reactions, in this case a rise in the cell internal pressure is determined, wherein a slow rise is interpreted as aging, while a fast rise is assessed as an indication of an acute hazard situation.

DE 10 2006 000 086 A1 discloses a rechargeable battery system comprising a rechargeable battery comprising a charging/discharging control section for controlling the battery in a control region, an anomaly detecting section for detecting anomalies and an anomaly processing section. The anomaly detecting section detects slight cell short-circuit anomalies of the battery on the basis of a block voltage of a battery monitoring unit.

DE 10 2008 062 656 A1 discloses a method for protecting a lithium-ion battery in a vehicle, wherein, for detecting a thermal and/or electrical overloading of the battery, parameters of the battery are automatically monitored, inter alia a current value, a voltage value, a temperature value and/or a cell internal pressure.

DE 10 2011 077 448 A1 discloses a method for estimating a state variable describing the state of an electrical energy store by means of a time-discreet comparison of operating variables with a mathematical model. Operating variables are the temperature, the load current and the terminal voltage.

It is an object of the invention to provide early detection of hazard situations caused by internal short circuits.

SUMMARY OF THE INVENTION

In a method according to the invention for detecting anomalies of a battery cell, it is provided that a short-circuit sensor system detects events in a signal of a terminal voltage of the battery cell, which events have successive edges in an interval of time of microseconds, and that events detected by the short-circuit sensor system are transmitted to a battery management system.

The detection of internal short circuits according to the invention is based on the identification of specific developments of the terminal voltage as a function of time, if appropriate taking account of a specific development of the current and/or of the cell internal pressure.

The invention is based on the hypothesis that at least some short circuits do not occur suddenly and immediately in a fully formed fashion, but rather are subject to an arising phase. Before a "hard" short circuit initiates thermal runaway of the battery cell, micro shorts occur. What is characteristic of such a micro short is that the short-circuiting element, for example a metal dendrite, a metallic particle or an electrical contact of the active materials can maintain the released power only for a very short time in the range of microseconds without melting, evaporating or sublimating in the process. If a longer influence lasting a few milliseconds occurs, the short circuit can come to a standstill again in the medium term, under certain circumstances, as a result of complete reaction or melting of the short-circuit forming element. In this way, initially "small" short circuits, i.e. micro shorts, form which later may be superseded by a more solid, electrically permanent connection of the electrodes with great evolution of heat at the damaged location.

Calculations show that micro shorts can bring about a current flow in the range of some amperes. This internal current causes a momentary dip in the terminal voltage by some mV.

The short-circuit sensor system is designed for detecting the micro shorts, i.e. for detecting events having successive edges in an interval of time of a few microseconds, in particular of 0.1 µs to 10 ms, preferably of 0.1 µs to 1 ms, more preferably of 0.1 to 100 µs, particularly preferably 0.5 to 10 µs, wherein the amplitude of the terminal voltage fluctuates in the mV range. The successive edges detected comprise for example a falling edge and a rising edge succeeding the latter, which hereinafter is also referred to as a voltage dip.

The detected events are provided with a time stamp by the short-circuit sensor system or, after transmission, by the battery management system and are thereafter stored in a memory element.

The battery management system determines anomalies of the battery cells on the basis of the detected events. In the case of a detected event, the battery management system can for example perform an emergency shutdown of the battery cell, of the battery module or of the entire battery or provide the information about the event to a vehicle control system that decides about the further reaction.

Preferably, a plausibilization of the detected events is additionally carried out.

According to one preferred embodiment, for plausibilization, the behavior of the battery cells at which the event was determined is compared with the behaviors of the further battery cells which are electrically interconnected with the battery cell.

As an alternative thereto or in addition thereto, the internal pressure of the battery cell is measured for plausibilization of the events. The internal pressure of the battery cell is measured by the short-circuit sensor system with a defined sampling rate. The measured values of the internal pressure can be transmitted either continuously or only when an event has been detected. In this case, the short-circuit sensor system comprises a buffer memory for the values of the internal pressure. The battery management system detects the anomalies of the battery cell on the basis of the determined events with evaluation of the internal pressure. In this case, the spontaneous rise in the cell internal pressure in the battery cell in which the event was determined is a supporting feature for a positively detected micro short. As a result of the high temperatures occurring locally, material, for example electrolyte, is evaporated or decomposed into gaseous reaction products. The occurrence of the micro shorts is coupled to a rise in pressure in the cell housing. The intensity of the micro short is defined by the magnitude of the current flow, the time duration of the current flow and the amount of decomposed material. The amount of decomposed material leads to a rise in pressure in the battery cell. The transition from a small to a hard short circuit can take place fluidly. The rise in pressure, in particular in the initial phase, can therefore turn out to be very small and lie at the limit of detectability.

According to one preferred embodiment, the battery management system operates the short-circuit sensor system for detecting the events in a state of the charging phase, in a state of the quiescent phase and in a state of the operating phase with different parameters. In this way, an adaptive method is proposed which makes possible a meaningful classification of the measurement signals in the different phases.

The charging phase in a CC/CV method is characterized in that a constant current intensity is initially applied to the battery cells (CC phase, constant current). When the end-of-charge voltage is reached, the current intensity is reduced in order to avoid exceeding the voltage (CV phase, constant voltage). The charging process is deemed to be concluded when the charging current intensity falls below a limit value, for example of a magnitude of one tenth of the initial charging current. Cell aging can also be deduced on the basis of a temporal lengthening of the CV phase. As a result of a rise in the self-discharge, increasingly more energy then has to be expended during charging. The current flow is observed and regulated in the battery management system.

When a micro short occurs in a battery cell, the terminal voltage of the affected battery cell dips momentarily for the reasons described. The short-circuit sensor system detects this dip. By way of example, for this purpose, the signal of the terminal voltage is amplified by means of a differentiator, wherein in the state of the charging phase the gain factors of the differential voltage monitoring are increased in a positive voltage direction in comparison with the state of the quiescent phase, for example right up to a noise limit.

When a micro short occurs in a battery cell, the charging regulator or the output capacitor thereof compensates for the voltage dip by increasing the current intensity. The increase in the current intensity leads to a rise in the terminal voltage in the case of the battery cells not affected by the micro short. The voltage rise is reduced by the number of battery cells in comparison with the dip, but acts on all the battery cells.

According to one preferred embodiment, in the case of an event detected in the charging phase, the battery management system detects an anomaly of the battery cells when voltage spikes of the terminal voltage are determined simultaneously in the case of at least one further battery cell, for example in the case of all of the battery cells interconnected with the affected battery cell, or in the case of a multiplicity of the battery cells. In this case, the voltage spikes are defined by events having successive edges in an interval of time of microseconds, at least one rising edge and a falling edges succeeding the latter. In this context, taking account of the reaction speeds of the electronics, in particular of the charging regulator, "simultaneous" means a period of time in the range of ns to μs.

According to one preferred embodiment, after a detected event in the charging phase, in addition, the cell internal pressure of the affected battery cell is picked up, the event is provided with a time stamp and transmitted to the battery management system. The cell internal pressure is used by the battery management system to support the plausibilization, wherein a small or unmeasurable rise in pressure denotes a small micro short and a larger rise in pressure in the range of mbar allows a conclusion to be drawn about a development toward increasingly more severe micro shorts.

In the quiescent phase the entire system is in a standby mode. The load current is almost zero in this case.

In the quiescent phase, in which internal short circuits occur with lower probability, the activity of the battery management system is reduced to a minimum in order to minimize the quiescent current consumption. Preferably, in the state of the quiescent phase the internal pressure of the battery cell is measured for example at a lower sampling rate than in the state of the charging phase. Typical sampling rates in this case are 1/s to 1/min, i.e. every second to every minute. Lower sampling rates in this case encompass 1/min to 1/10 min, i.e. every minute to once per 10 minutes. In order to determine the anomalies of the battery cell in the quiescent phase, the short-circuit sensor system firstly detects an event and thereafter transmits a signal for waking up the battery management system. At the same time the cell internal pressure is picked up and the event is provided with a time stamp, wherein this last can be carried out before or after the transmission to the battery management system.

According to one advantageous configuration, in the case of an event detected in the quiescent phase, the battery management system rules out an anomaly of the battery cell if a simultaneous voltage dip is determined in the case of at least one further battery cell. If a plurality or all of the battery cells have detected a voltage dip, it is highly probable that no micro short is present. The simultaneous occurrence in a plurality of battery cells is regarded as statistically unlikely. A load current or a fault current is presumably involved in this case. In this context, "simultaneously" means a period of time in the range of ns to μs.

In this case, in addition, it is possible to use the sensor data of the current sensor in the battery management system for plausibilization.

The operating phase is distinguished by the fact that all the battery cells provide the same, generally very high, load current. The detection of specific changes in the voltage and the detection of very small transient changes in the voltage are presumably not possible in practice. In regular operation, therefore, preferably the rise in pressure is monitored and the reporting to the battery management system is carried out in accordance with the method specified in US 2013/0122332 A1, for example.

The invention furthermore proposes a short-circuit sensor system for detecting an anomaly of a battery cell, said short-circuit sensor system comprising a voltage sensor and an evaluator, wherein the evaluator is designed to detect events in the signal of a terminal voltage of the battery cell with successive edges in an interval of time of microseconds, and a communication device designed for transmitting events detected by the evaluator to a battery management system.

Preferably, the short-circuit sensor system is embodied and/or designed for carrying out the methods described herein. Accordingly, the features described in the context of the methods correspondingly apply to the short-circuit sensor system, and conversely the features described in the context of the short-circuit sensor system correspondingly apply to the methods.

The evaluator has particularly preferably a temporal resolution in the µs range and additionally preferably a resolution of voltages in the mV range.

The evaluator comprises functional units which are not necessarily physically separable from one another. In this regard, a plurality of functional units of the evaluator can be realized in a single physical unit, for instance if a plurality of functions are implemented in software. Furthermore, the functional units of the evaluator can also be realized in hardware, for example by application specific integrated circuits (ASIC) or in memory units.

The short-circuit sensor system is arranged for example in the interior of a housing of the battery cell, wherein the communication device has a wireless connection or a wired connection to the battery management system. An arrangement of the short-circuit sensor system outside the housing of the battery cell is likewise possible, wherein at least the pressure sensor possibly present for detecting the cell internal pressure is preferably arranged in the interior of the housing of the battery cell. The cell internal pressure is likewise preferably transmitted to the battery management system via the communication device.

According to one embodiment, the short-circuit sensor system comprises a differentiator, which provides a signal of a differentiated terminal voltage of the battery cell. The evaluator then detects the events in the signal of the differentiated terminal voltage.

According to one embodiment, the evaluator comprises a threshold value detector. In this case, the evaluator is designed to carry out digital, analog or a combination of digital and analog signal processing.

In the case of digital signal processing, the terminal voltage is digitized at a high data rate for example in the range of MHz. The detection of momentary voltage changes is preferably carried out by means of a threshold value analysis. In this embodiment, the proportion of analog circuit parts is minimal. In this case, the comparatively high power demand in the range of 10 to 100 mW per battery cell should be taken into account, which results from the high clock rate and would also have to be expended in the quiescent phases. The self-discharge of the battery cell in the case of fully digital signal processing is estimated to be approximately 1% per day.

Alternatively, the detection of the transient voltage signals can be carried out in an analog manner. For this purpose, the terminal voltage is high-pass filtered and amplified. With the aid of analog threshold value switches, the specific signals can then be detected.

A combination of both approaches in the form of an analog detection of the successive edges in the signal of the differentiated terminal voltage as trigger signal for the digital signal processing is likewise conceivable and preferred.

As an alternative thereto or in addition thereto, for instance for plausibilization, the evaluator processes a signal of the terminal voltage of the battery cell that is amplified in another way. For this purpose, the short-circuit electronic system comprises for example a capacitor connected in parallel with the battery cell. The evaluator preferably comprises a narrow band detector.

The capacitor (the C-element) together with the battery cell (the L-element as the parasitic property of the winding) forms an LC resonant circuit having resonant frequencies in the range of 1 to 100 MHz, which acts as a bandpass filter, i.e. resonant filter, for the short-circuit sensor system. In the case of this solution, reactive electrical components of the battery cells are made usable for an indirect detection of the event. This takes account of the fact that the battery network is embodied with extremely low resistance with regard to the direct-current properties. The radio-frequency properties are typically of secondary importance for the primary purpose of use of the battery. The radio-frequency properties of the electrical network are utilized in order to be able to detect the specific signal using electronics of low complexity.

In the dimensioning of the capacitor and the detector, it is assumed that in the battery cell the inductive portion of the cell impedance, which is caused by the arresters and the cell windings, is typically between 5 and 50 nH. Depending on the position of the internal short circuit, the current flows through elements which have an inductive portion of different magnitudes. A transient current flow generates at the inductive elements a voltage boost that may amount to a number of volts. The voltage boost can be ascertained by means of threshold value detection. The current pulse or the voltage reaction excites the resonant circuit.

The frequency spectrum typically emitted by the battery cells in the case of micro shorts is fed to the narrow band detector. In this case, the detector can be embodied as a linearly operating radio-frequency amplifier or as a heterodyne receiver or else as a digitally operating frequency-selective receiver. Particularly in the quiescent state of the battery cells, this method is extremely sensitive down to the sub-mV range. In this case, the direct signal or the signal amplified via an intermediate frequency circuit is then fed to an amplitude measuring circuit and/or a spectrum analyzer that measures both the temporal profiles of the signal amplitude and the typical temporal profile of the spectrum and the spectrum. In this regard, reliable time and frequency information about the cell signal is obtained. In this case, the micro short that formed can then be clearly identified by the evaluator as a pattern in the amplitude and frequency period.

Alternatively, the detector is a narrow band receiver which is tuned to the resonant frequency of the LC resonant circuit and which is electromagnetically coupled to the battery cell. Signal frequencies in the range of a plurality of MHz and effective conductor lengths in the range of 20 to 50 cm enable an emission of the signal here in principle.

BRIEF DESCRIPTION OF THE DRAWINGS

Exemplary embodiments of the invention are illustrated in the drawings and explained in greater detail in the following description.

In the figures.

In the following description of the exemplary embodiments of the invention, identical or similar components are designated by identical or similar reference signs, a repeated description of these components being dispensed with in individual cases. The figures merely schematically illustrate the subject matter of the invention.

DETAILED DESCRIPTION

Figure 1:
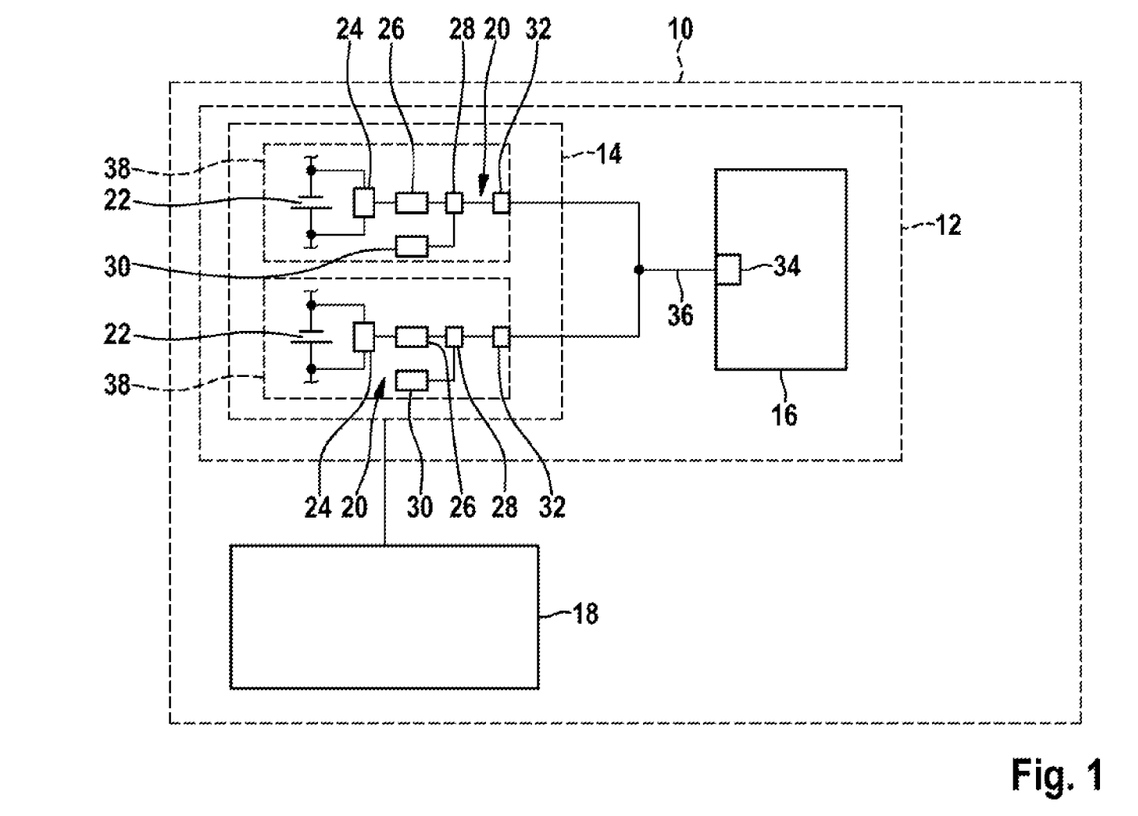
FIG. 1 shows a motor vehicle comprising a battery system.

FIG. 1 shows a motor vehicle 10 comprising a battery system 12.

The motor vehicle 10 in FIG. 1 can be configured as a purely electrically driven vehicle or as a hybrid vehicle additionally having an internal combustion engine. For this purpose, the motor vehicle 10 is equipped with an electrical drive system 18, which drives the motor vehicle 10 at least partly electrically via an electric motor (not illustrated).

The electrical energy is provided by a battery 14. The battery 14 comprises a plurality of battery cells 22 or rechargeable battery cells, for example lithium-ion cells having a voltage range of 2.8 to 4.2 V. In the present description, the terms "battery" and "battery cell" are used for rechargeable battery and rechargeable battery cell, respectively, in a manner adapted to customary linguistic usage.

The battery 14 typically comprises one or a plurality of battery units, by which term a battery cell 22, a battery module, a module string or battery pack can be designated. In the battery 14, the battery cells 22 are preferably spatially combined and connected to one another in terms of circuitry, generally interconnected in series or in part also in parallel to form modules. A plurality of modules can form so-called battery direct converters (BDC) and a plurality of battery direct converters can form a battery direct inverter (BDI).

The battery 14 is part of the battery system 12, which additionally comprises a battery management system 16. The battery management system 16 typically comprises a main control unit (BCU), and a plurality of sensor control units (CSC) which are assigned to the battery modules.

Each battery cell 22 is assigned a short-circuit sensor system 20, which is arranged in the cell housing 38 here by way of example and which comprises in this exemplary embodiment a voltage sensor 24, a differentiator 26, an evaluator 28, a pressure sensor 30, and also a communication device 32. In alternative embodiments (not illustrated), the short-circuit sensor system 20 can be arranged partly or else wholly outside the cell housing 38. The differentiator 26 is optionally present. Moreover, the short-circuit sensor system 20 comprises a capacitor 80 (not illustrated), which provides the evaluator 28 with a signal for further processing. This set-up emerges in particular from FIG. 4.

The voltage sensor 24 detects the terminal voltage of the battery cell 22. The differentiator 26 is connected downstream of the voltage sensor 24, said differentiator providing a signal of a differentiated terminal voltage of the battery cell 22 from the signal of the terminal voltage. The differentiator 26 is controllable by the battery management system 16 in such a way that its gain factors can be set, in particular depending on the quiescent phase, the charging phase or the operating phase of the battery 14.

The differentiator 26 provides the signal of the differentiated terminal voltage of the battery cell 22 to the evaluator 28, which detects events 44 from the signal of the differentiated terminal voltage of the battery cell 22 for example by means of a threshold value detector, which events have successive edges in an interval of time of microseconds.

The evaluator transmits detected events 44 to the battery management system 16 via the communication device 32. The battery management system 16 likewise comprises a correspondingly designed communication device 34.

In the embodiment illustrated, the pressure sensor 30 is connected to the evaluator 28 and is preferably settable in particular in terms of its sampling rate by the battery management system 16 via the communication devices 32, 34. In further embodiments (not illustrated), the pressure sensor 30 is directly connected to the communication device 32, such that the evaluator 28 only performs the detection of the events 44 and not the control of the pressure sensor 30.

The communication of the short-circuit sensor system 20 with the battery management system 16 takes place via a communication channel 36, for instance an SPI bus (serial peripheral interface bus) or a CAN bus (controller area network bus). Advantageously, in the case of the method and devices presented, restrictions of the bandwidth of the busses typically used, for example of the CAN bus, are not important since a large part of the evaluation is not carried out in the battery management system 16, but rather can already be carried out in the evaluator 28 assigned to the individual battery cell 22. If all measured values had to be transmitted via the communication channel 36, a high temporal resolution for example for 100 battery cells 22 interconnected in series with one another would not be possible.

FIGS. 2a-2d show a profile of the terminal voltage U and the current intensity I of different battery cells 22 against time t during the charging process, wherein the charging process has a CI phase 40, in which a constant current intensity is applied to the battery cells 22, and a CV phase 42, wherein the current intensity is reduced when an end-of-charge voltage $U_f$ is reached. The end of the CV phase 42 is determined by the current intensity I falling below a limit value, for example below $\frac{1}{10}$ of the initial value.

Figure 2A:
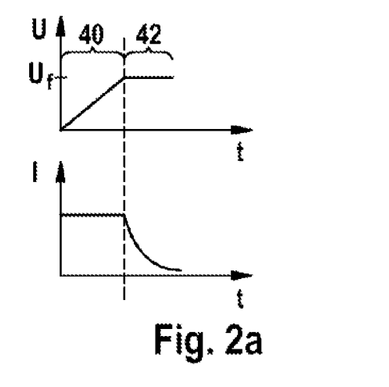
FIGS. 2a-2d show a profile of the terminal voltage of different battery cells during a charging process.

In FIG. 2a the battery cell 22 is as new, and so the terminal voltage to a first approximation rises linearly in the CI phase 40 and remains constant in the CV phase 42. The profile of the current intensity is constant in the CI phase 40 and falling in the CV phase 42.

Figure 2B:
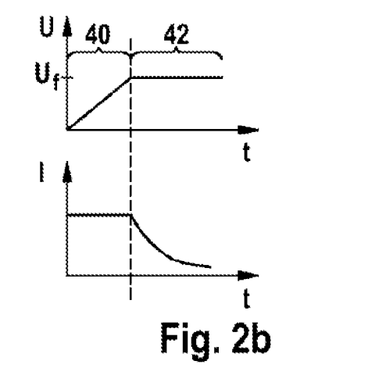

FIG. 2b shows the profile of the terminal voltage U and of the current intensity I of an aged battery cell 22. In comparison with FIG. 2a it can be established that the CV phase 42 is lengthened. Here, too, the end of the CV phase 42 is determined by the current intensity I falling below a limit value. The lengthening of the CV phase 42 forms an indicator of the cell aging.

Figure 2C:
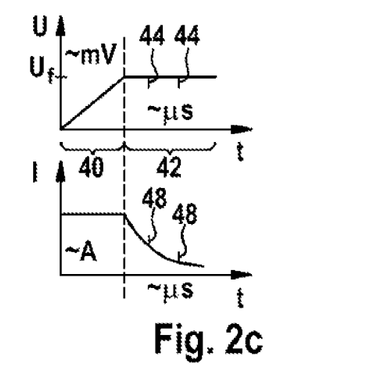

FIG. 2c illustrates the profile of the terminal voltage U and of the current intensity I of a battery cell 22 in which the above-described events 44 (micro short) occur in the CV phase 42. When an event 44 occurs in the battery cell 22, the terminal voltage U of the affected battery cell 22 dips momentarily for the reasons described. The charging regulator compensates for the dip in the terminal voltage by increasing the current intensity. The increase in the current intensity leads to the illustrated current spikes 48, which occur and are detectable in principle in all battery cells 22 interconnected with the battery cell 22.

Figure 2D:
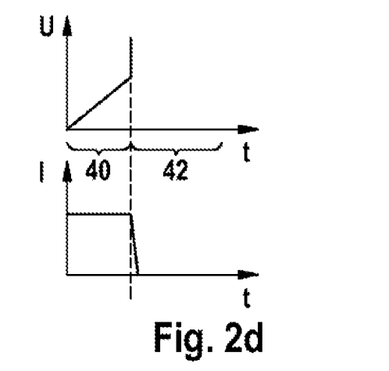

FIG. 2d shows the profile of the terminal voltage U and of the current intensity I of a battery cell 22 in which thermal runaway occurs. An uncontrolled rise in the terminal voltage U and a drastic fall in the current intensity I take place here for example in the CV phase 42.

Figure 3:
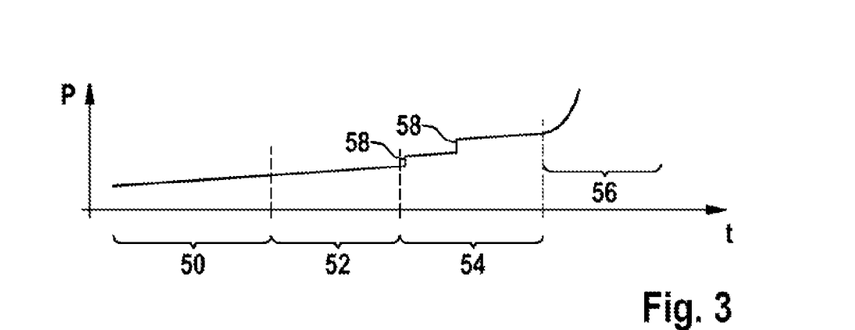
FIG. 3 shows a development of a cell internal pressure over the lifetime of a battery cell.

FIG. 3 shows an illustration of the development of the cell internal pressure over the lifetime of a battery cell 22.

In a first life section 50, a continuous rise in the cell internal pressure P takes place as a result of cyclic and calendric aging of the battery cell 22. A second life section 52 exhibits the behavior of an aged battery cell 22. The rise in pressure here is formed to an extent that is just as great as in the first life section 50. A greater rise in pressure would also be possible in the second life section 52. In a third life section 54, events 44 occur which are associated with a spontaneous rise 58 in pressure and which are detected by the measures of the invention. In a fourth life section 56 of the battery cell 22, thermal runaway is illustrated, in the case of which a great rise in the cell internal pressure P can be ascertained and it is possible to react to this using known methods.

Figure 4:
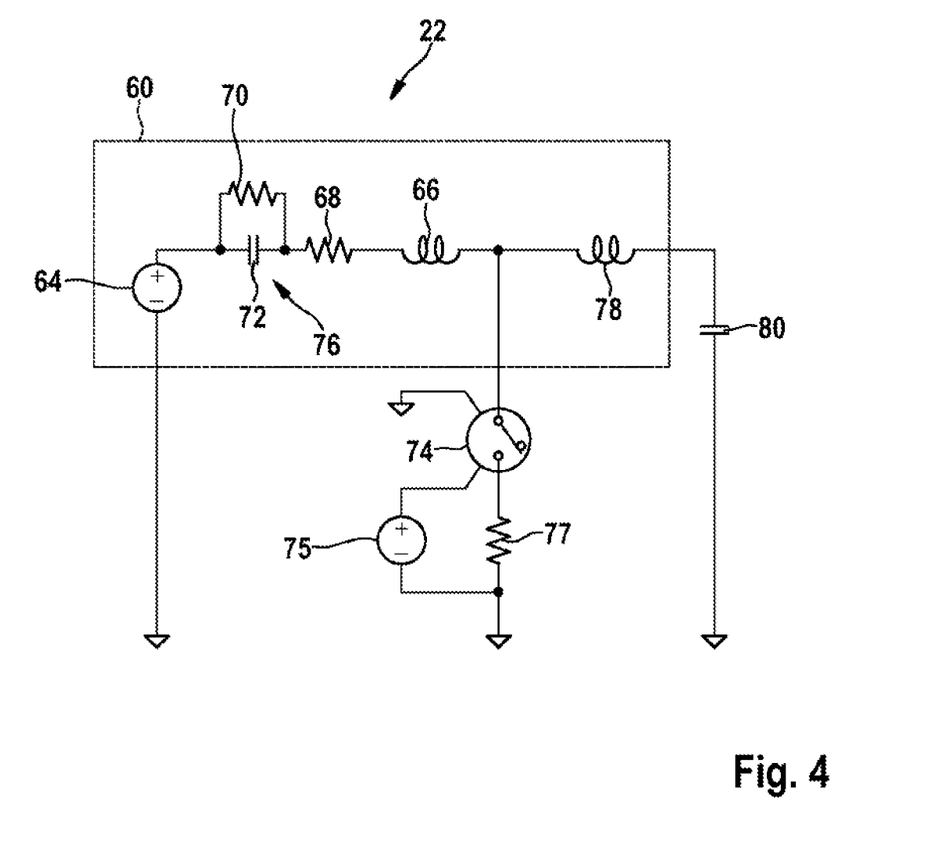
FIG. 4 shows a simulation set-up of a micro short with a battery cell and external circuitry for generating an electrical resonance.

FIG. 4 shows a circuit diagram for the simulation of an event 44 with the aid of a switch 74. The illustration shows a battery cell 22 and a capacitor 80, wherein the battery cell 22 and the capacitor 80 are connected in parallel with one another. The switch 74 is closed in the case of a short-circuit.

In the opened state of the switch 74, the battery cell 22 is represented by an equivalent circuit diagram 60 comprising an RC element 76, a series-connected resistor 68, two series-connected inductances 66, 78 and a series-connected voltage source 64. The RC element 76 comprises a resistor 70 and a capacitor 72 connected in parallel with one another. Since the short-circuit can occur at an arbitrary position in the battery cell 22, the switch 74 is arranged between the two inductances 66, 78. In this case, the switch 74 is arranged in a branch between the inductances 66, 78 and ground.

For the purpose of simulating the internal short-circuit, a voltage source 75 and a resistor 77 connected in parallel therewith are arranged in the branch of the closed switch 74.

For simulation purposes, a dimensioning of the components as follows was assumed:
Resistor 68: 0.5 mΩ
First inductance 66: 10 nH
Resistor 70: 0.5 mΩ
Capacitor 72: 35 F
Resistor 77: 1Ω
Second inductance 78: 10 nH
Capacitor 80: 1000 pF The values represent typical values for a battery cell 22 used in a motor vehicle 10. They can in each case also deviate by a factor of 10 to 100.

Figure 5A:
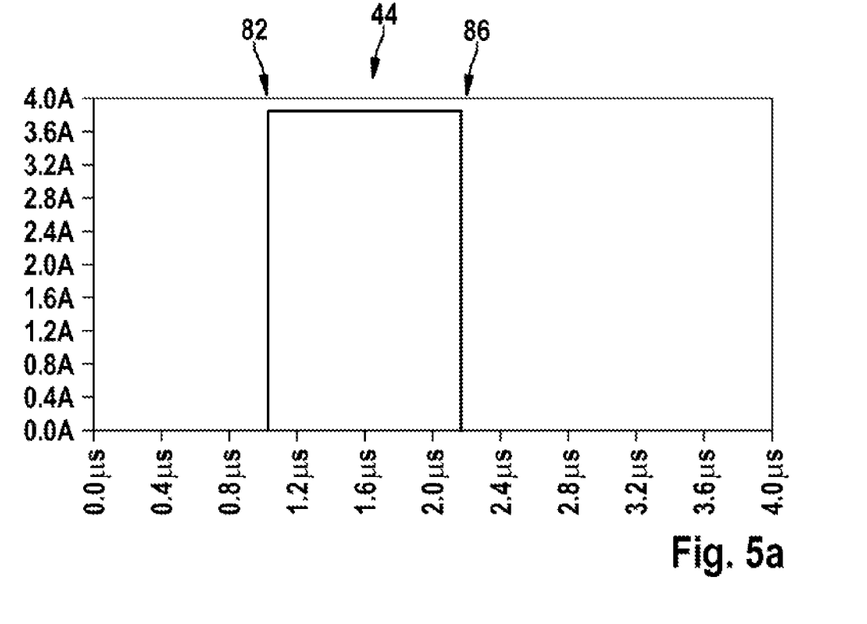
FIG. 5a and FIG. 5b show an exemplary current pulse of a micro short and a corresponding voltage reaction.
Figure 5B:
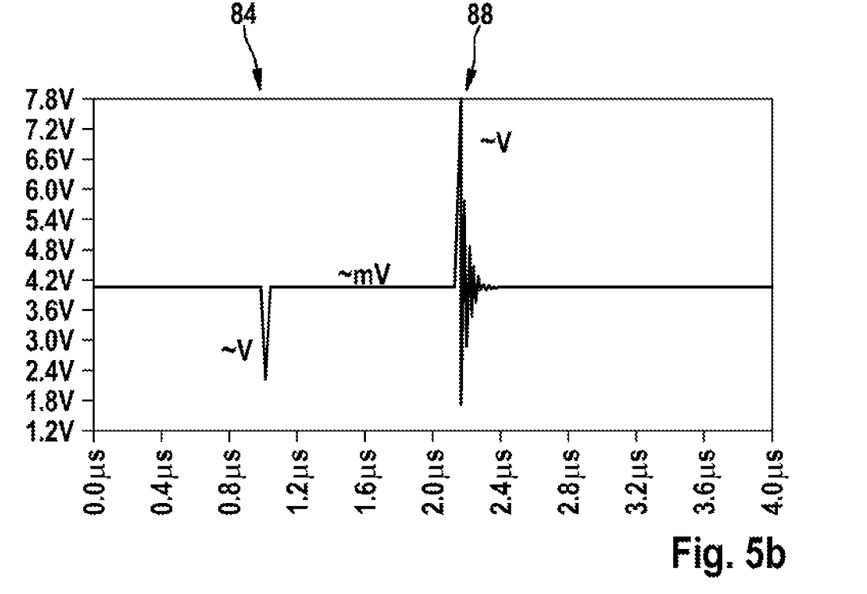

FIGS. 5a and 5b show by way of example the profile of a current intensity and of a voltage in the case of an event 44 which was simulated in the case of the system comprising the battery cell 22 and capacitor 80 as illustrated in FIG. 4.

In the current profile illustrated in FIG. 5a, an excursion with a magnitude of somewhat less than 4 A is illustrated over a period of time of approximately 1.2 μs, which corresponds to an activation of the switch 74. A first excursion 84 of the voltage illustrated in FIG. 5b, said first excursion being of the order of magnitude of approximately 1 to 3 V, is linked with a first, rising current edge 82. A second excursion 88 of the terminal voltage can be observed with a second, falling current edge 86, whereupon a damped oscillation ensues. Although an oscillation likewise occurs with respect to the first excursion 84, on account of a resistance arising as a result of the bridging said oscillation is greatly damped in such a way that no further zero crossings are visible.

The oscillation at the second excursion 88 is detected with the aid of the evaluator 28. For this purpose, the evaluator 28 comprises a narrow band detector, for example a linearly operating radio-frequency amplifier, a heterodyne receiver or a digitally operating frequency-selective receiver.

The invention is not restricted to the exemplary embodiments described herein and the aspects highlighted therein. Rather, a multiplicity of modifications that are within the scope of the action of a person skilled in the art are possible within the scope specified by the claims.

The invention claimed is:

1. A method for detecting anomalies of a battery cell (22), the method comprising:
   detecting, via a short-circuit sensor system, events (44) in a signal of a terminal voltage of the battery cell (22), which events have successive edges in an interval of time of microseconds, and
   transmitting the events (44) detected by the short-circuit sensor system to a battery management system (16),
   wherein the battery management system operates the short-circuit sensor system in a charging phase, a quiescent phase, and in an operating phase with different parameters, and
   wherein, in the case of an event detected in the charging phase, the battery management system detects an anomaly of the battery cell if a voltage spike of the terminal voltage is determined simultaneously in at least one additional battery cell.

2. The method as claimed in claim 1, wherein the internal pressure of the battery cell (22) is measured for plausibilization of the events (44).

3. The method as claimed in claim 1, wherein, in the case of an event (44) detected in the quiescent phase, the battery management system (16) rules out an anomaly of the battery cell (22) if a simultaneous voltage dip (46) of at least one additional battery cell (22) is determined.

4. A short-circuit sensor system (20) for detecting an anomaly of a battery cell (22), the system comprising:
   a voltage sensor (24) and
   an evaluator (28), wherein the evaluator (28) is designed to detect events (44) in the signal of a terminal voltage of the battery cell (22) with successive edges in an interval of time of microseconds, and
   a communication device (32) designed for communicating events (44) detected by the evaluator (28) to a battery management system (16),
   wherein the battery management system operates the short-circuit sensor system in a charging phase, in a quiescent phase, and in an operating phase with different parameters and
   wherein, in the case of an event detected in the charging phase, the battery management system detects an anomaly of the battery cell if a voltage spike of the terminal voltage is determined simultaneously in the case of at least one additional battery cell.

5. The short-circuit sensor system (20) as claimed in claim 4, comprising a pressure sensor (30) for detecting a cell internal pressure.

6. The short-circuit sensor system (20) as claimed in claim 4, comprising a differentiator (26), which provides a signal of a differentiated terminal voltage of the battery cell (22).

7. The short-circuit sensor system (20) as claimed in claim 4, wherein the evaluator (28) has a threshold value detector.

8. The short-circuit sensor system (20) as claimed in claim 4, comprising a capacitor (80) connected in parallel with the battery cell (22).

9. The short-circuit sensor system (20) as claimed in claim 8, wherein the evaluator (28) has a narrow band detector.

10. A battery system (12) comprising a plurality of battery cells (22) and short-circuit sensor systems (20) as claimed in claim 6 which are respectively assigned to the battery cells (22) and comprising a battery management system (16) designed to determine anomalies of the battery cells (22) on the basis of detected events (44).

\* \* \* \* \*